United States Patent
Breynaert

(10) Patent No.: US 12,034,393 B2
(45) Date of Patent: Jul. 9, 2024

(54) PARASITIC PULSE CANCELATION CIRCUIT

(71) Applicant: INTEVA PRODUCTS, LLC, Troy, MI (US)

(72) Inventor: François Breynaert, Caen (FR)

(73) Assignee: INTEVA PRODUCTS, LLC, Troy, MI (US)

(*) Notice: Subject to any disclaimer, the term of this patent is extended or adjusted under 35 U.S.C. 154(b) by 25 days.

(21) Appl. No.: 17/715,228

(22) Filed: Apr. 7, 2022

(65) Prior Publication Data
US 2022/0360206 A1    Nov. 10, 2022

(30) Foreign Application Priority Data
Apr. 9, 2021  (FR) .................................... 21/03683

(51) Int. Cl.
| | |
|---|---|
| H02P 27/08 | (2006.01) |
| H02P 29/00 | (2016.01) |
| H03K 19/20 | (2006.01) |

(52) U.S. Cl.
CPC .............. *H02P 29/00* (2013.01); *H03K 19/20* (2013.01)

(58) Field of Classification Search
CPC ........ H02P 7/0094; H02P 27/08; H02P 29/00; H03K 19/20
See application file for complete search history.

(56) References Cited

U.S. PATENT DOCUMENTS

| | | | | |
|---|---|---|---|---|
| 6,078,154 A * | 6/2000 | Manlove | .................. | H02P 6/18 318/293 |
| 6,559,616 B2 * | 5/2003 | Aoki | ..................... | H02P 7/2805 318/807 |
| 7,668,690 B2 * | 2/2010 | Schneider | ................. | H02P 6/10 318/470 |
| 8,725,440 B2 * | 5/2014 | Knezevic | ................. | G01P 3/48 702/65 |
| 11,177,809 B2 | 11/2021 | Breynaert et al. | | |

(Continued)

FOREIGN PATENT DOCUMENTS

| | | |
|---|---|---|
| FR | 3076677 A1 | 7/2019 |
| FR | 3076678 A1 | 7/2019 |
| JP | 2007236032 A | 9/2007 |

OTHER PUBLICATIONS

Search Report Issued in French Application No. 21/03683; Application Filing Date Apr. 9, 2021; Date of Mailing Dec. 2, 2021 (7 pages).

*Primary Examiner* — Thai T Dinh
(74) *Attorney, Agent, or Firm* — CANTOR COLBURN LLP

(57) ABSTRACT

A motor control system includes a direct current (DC) motor and a ripple count circuit. The DC motor includes a rotor induced to rotate in response to a drive current generated by a supply voltage. The rotation of the rotor generates a mechanical force that drives a component. The ripple count circuit includes an active filter circuit and a parasitic pulse cancellation circuit. The active filter circuit is configured to filter the drive current and to generate a pulsed signal containing at least one parasitic pulse. The parasitic pulse cancelation circuit is in signal communication with the ripple count circuit to receive the pulsed signal and to output a ripple count signal based on the pulsed signal. The ripple count signal excludes the at least one parasitic pulse.

9 Claims, 3 Drawing Sheets

(56) References Cited

U.S. PATENT DOCUMENTS

| | | | |
|---|---|---|---|
| 11,398,787 B2* | 7/2022 | Sullivan | H02P 7/2913 |
| 2012/0188009 A1* | 7/2012 | Alexander | H03F 3/45973 |
| | | | 330/69 |
| 2014/0001815 A1* | 1/2014 | Tanaka | B60N 2/02 |
| | | | 318/474 |
| 2014/0028235 A1* | 1/2014 | Knezevic | G01D 3/032 |
| | | | 318/490 |
| 2019/0006970 A1* | 1/2019 | Sullivan | H02P 7/2913 |
| 2020/0343842 A1 | 10/2020 | Breynaert et al. | |

* cited by examiner

PARASITIC PULSE CANCELATION CIRCUIT

CROSS-REFERENCE TO RELATED APPLICATIONS

This application claims benefit to French Application No. 21/03683, filed Apr. 9, 2021, the disclosures of which are incorporated by reference herein in their entirety.

TECHNICAL FIELD

Exemplary embodiments of the present disclosure are related to direct current (DC) motors, and more particularly, to DC motors for operating electrically operated automotive components.

BACKGROUND

Automobile vehicles are increasingly equipped with electrically operated adjustable components. For example, vehicles typically include sliding roofs, window glass regulators, rear view mirrors, or seats driven by electric DC motors. Information indicating the rotor speed of the motor can be utilized to determine a position of the adjustable component. Conventional position measurement systems utilize a sensor in conjunction with a magnetic ring to determine the rotor speed of the motor. For example, a Hall Effect Sensor (HES) detects movements of a magnetic ring integrated with the rotor. The magnet ring generates a magnetic flux of varying strength towards the HES depending on the relative axial position of the magnetic ring and sensor. The magnetic flux induces a current, and variations in magnetic flux result in variations in the induced currents. Accordingly, the frequency of the current measured by the HES is indicative of the rotor speed of the DC motor.

Other positional measurement systems have attempted to utilize a speed-proportional signal in order to determine a position of an adjustment device of a motor vehicle. However, these attempts have required the implementation of highly expensive controllers such as Field Programmable Gate Arrays (FPGAs), for example, to execute the computations necessary to obtain the targeted ripple currents. In other attempts, the entire motor assembly has been structurally modified with the goal of generating a normalize ripple pattern that eliminates ripple errors (e.g., parasitic pulses) and signal noise. Modifying the motor assembly, however, has proven to be overly expensive and results in limitations to the motor's overall performance.

SUMMARY OF THE INVENTION

According to a non-limiting embodiment, a motor control system includes a direct current (DC) motor and a ripple count circuit. The DC motor includes a rotor induced to rotate in response to a drive current generated by a supply voltage. The rotation of the rotor generates a mechanical force that drives a component. The ripple count circuit includes an active filter circuit and a parasitic pulse cancellation circuit. The active filter circuit is configured to filter the drive current and to generate a pulsed signal containing at least one parasitic pulse. The parasitic pulse cancellation circuit is in signal communication with the ripple count circuit to receive the pulsed signal and to output a ripple count signal based on the pulsed signal. The ripple count signal excludes the at least one parasitic pulse.

According to another non-limiting embodiment, a method of controlling a motor control system is provided. The method comprises generating a drive current using a supply voltage and delivering the drive current to a direct current (DC) motor, and rotating a rotor of the motor in response to the drive current to drive a component. The method further comprises filtering the drive current using an active filter circuit and generating a pulsed signal based on the filtered drive current, the pulsed signal containing at least one parasitic pulse. The method further comprises delivering the pulsed signal 202 to the parasitic pulse cancelation circuit 111 and generating, via the parasitic pulse cancelation circuit 111, a ripple count signal 206 based on the pulsed signal 202, the ripple count signal 206 excluding the at least one parasitic pulse 205.

The above-described and other features and advantages of the present invention will be appreciated and understood by those skilled in the art from the following detailed description, drawings, and appended claims.

BRIEF DESCRIPTION OF THE DRAWINGS

Embodiments of the present invention will now be described, by way of example only, with reference to the accompanying drawings in which.

DETAILED DESCRIPTION

Figure 1:
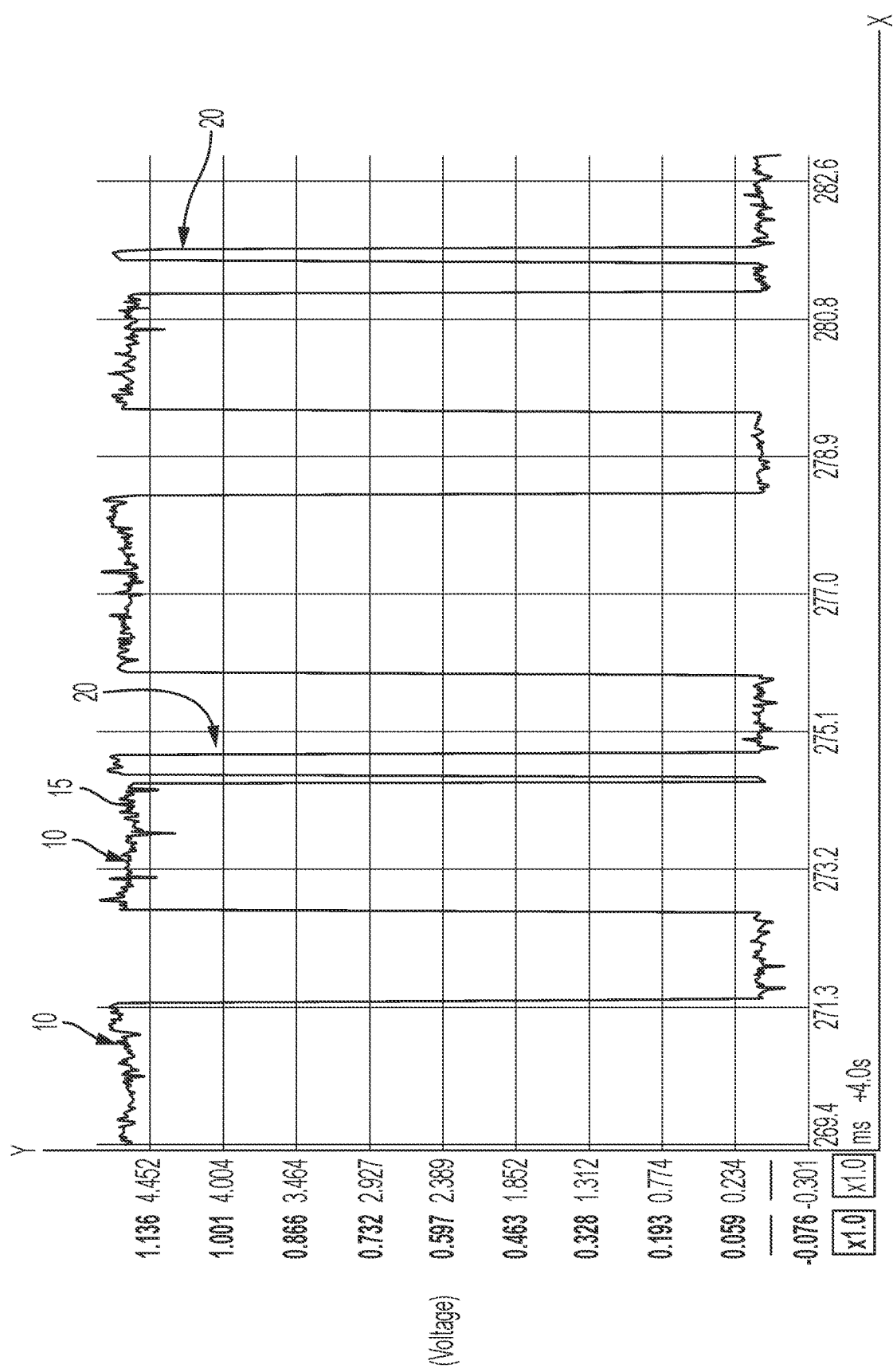
FIG. 1 is a signal diagram illustrating a parasitic pulse included in a ripple signal output from a conventional ripple count circuit.

Referring to FIG. 1, ripple signals 10 associated with electric DC motors are typically processed using either a software approach or a hardware approach. However, the ripple signal 10 may include desirable pulses 15 to be utilized in analyze the operation of the DC motor and one or more undesirable parasitic pulses 20. The parasitic pulses 20 can disturb the signal processing (e.g., ripple pulse counting) and cause inaccurate readings associated with the operation of the DC motor. Therefore, both the software approach and the hardware approach must account for the parasitic pulses 20.

In terms of the software approach, for example, a CPU (e.g., microcontroller) can sample the ripple signal, detect parasitic pulses, and process the ripple signal to remove the undesired parasitic pulses. However, the signal processing carried out by the CPU results in additional CPU processing time and increased power consumption. In addition, employing CPUs capable of effectively processing the ripple count signal to remove the parasitic pulses can prove to be expensive.

Hardware approaches are known to implement an amplifier that serves as an active bandpass filter for removing noise while allowing the input signal to pass. CPU processing power is conserved because CPU signal analysis and processing are not required to filter the signal. However, when a DC motor is under load and powered at low voltages, some parasitic pulses may have voltage levels that match or substantially match the voltage levels of the input signals applied to the amplifier. Consequently, the undesired parasitic pulses are allowed to pass through the bandpass filter and can appear in the output signal.

Various non-limiting embodiments described herein provide a hardware approach for eliminating parasitic pulses from a ripple signal associated with a DC motor circuit without expending CPU processing. In one or more non-limiting embodiments, a parasitic pulse cancelation circuit is provided which effectively filters parasitic pulses having a voltage level less than the threshold of the logic gate during a targeted time duration (e.g., for a time of less than about 300 μs). In one or more non-limiting embodiments, the parasitic pulse cancelation circuit described herein includes a logic gate that operates in conjunction with a bandpass filter and a pulse cancellation filter.

The logic gate includes an "OR" gate, for example, having a first input directly connected to the output of the bandpass filter. The pulse cancellation filter includes a low-pass input terminal connected directly to the output of the bandpass filter and a low-pass output terminal connected directly to a second input of the logic gate. The pulse cancellation filter can be configured so that it filters out parasitic pulses having a voltage level less than the threshold of the logic gate during a targeted time duration, e.g., less than about 300 μs. For example, when the second input of the OR gate is set to a logic "0" for a time less than about 300 μs, the first input of the OR gate remains above the threshold of the logic gate. Accordingly, the OR gate will not change state based on its gate logic (e.g., OR gate truth table) such that the parasitic pulse will be excluded from the ripple signal delivered from the output of the OR gate without expending additional CPU processing.

Figure 2:
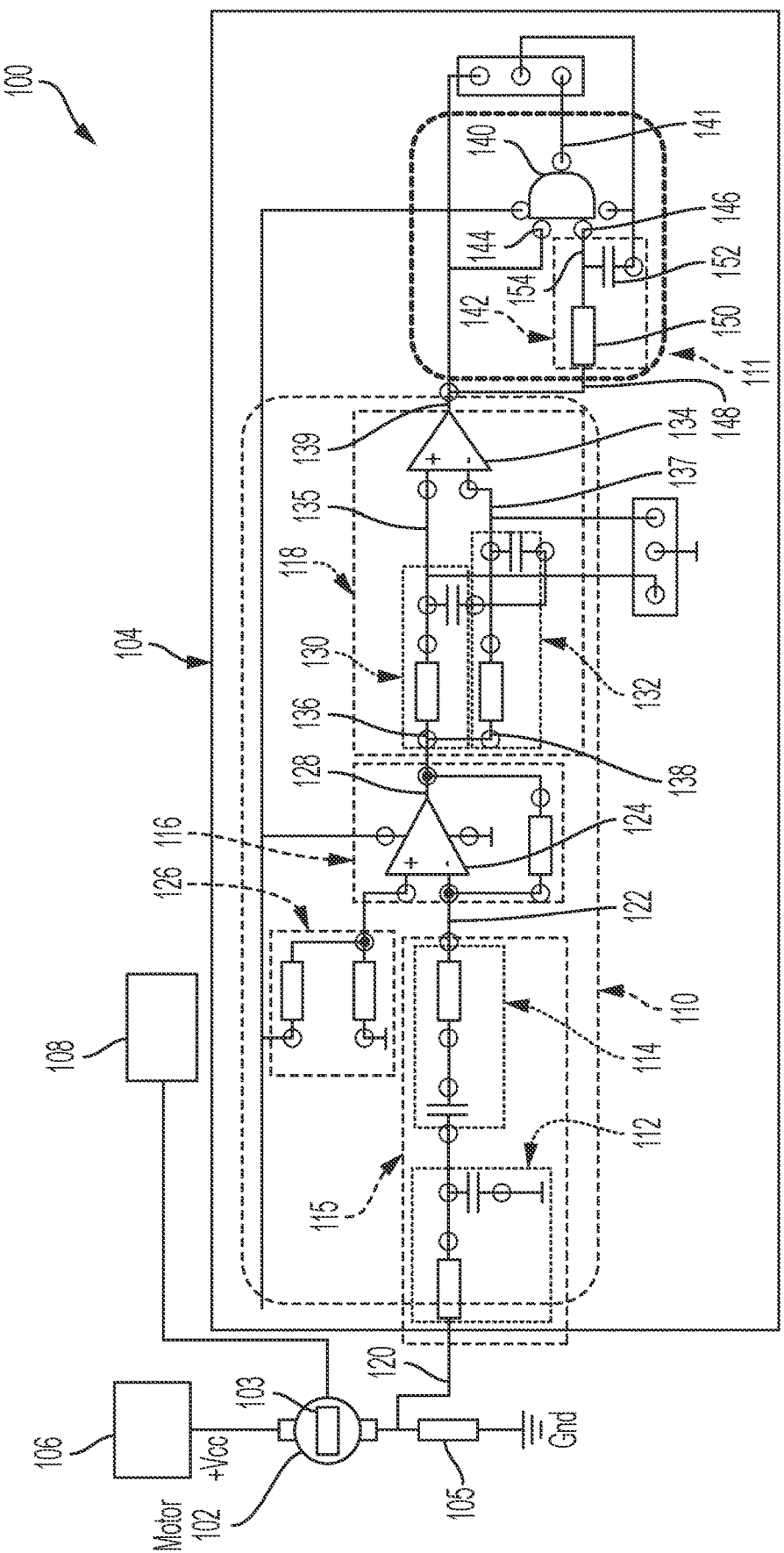
FIG. 2 is a schematic diagram of a motor control system including a ripple count circuit that employs a parasitic pulse cancellation circuit according to a non-limiting embodiment.

With reference now to FIG. 2, a motor control system 100 is illustrated according to a non-limiting embodiment. The motor control system 100 includes a motor 102 and a ripple count circuit 104. The motor 102 includes a DC motor 102, which is in signal communication with a power supply 106. The power supply 106 can include, for example, an electronic hardware controller 106 which outputs a variable supply voltage (+Vcc).

The DC motor 102 includes a rotor 103 induced to rotate in response to a drive current generated by the variable supply voltage (+Vcc). The rotation of the rotor 103 generates a mechanical force that drives a component 108. Going forward, the component 108 will be described in terms of an automotive vehicle window regulator unit 108. It should be appreciated, however, that other components 108 can be driven by the DC motor 102 including, but not limited to, a sliding roof, rear view mirrors, adjustable seats, etc. In terms of a window glass regulating unit 108, for example, the DC motor 102 can drive various mechanical components to vary the position of a glass window (e.g., move the window up or down). The input supply voltage (+Vcc) can be actively controlled to vary the voltage level applied to the DC motor 102, thereby adjusting the speed of the rotor 103, and thus the speed at which to move the glass window. A shunt resistor 105 can be connected to the output terminal of the motor 102 to measure AC or DC electrical drive current based on the voltage drop the drive current produces across the resistor 105.

The ripple count circuit 104 includes an active filter circuit 110 and a parasitic pulse cancelation circuit 111. The active filter circuit 110 is configured to filter the drive current based on the rotational speed (ω) of the rotor 103 and to generate a pulsed ripple output signal indicative of the rotational speed (ω) of the rotor 103 and a rotational position (θ) of the rotor 103. As described herein, the pulsed ripple signal output by the active filter circuit 110 includes a desirable pulse that can be utilized to analyze the operation of the motor 102, but may also include one or more undesirable parasitic pulses. The parasitic pulse cancelation circuit 111 is configured to eliminate the parasitic pulses from the ripple signal. Accordingly, the output ripple signal provided by the parasitic pulse cancelation circuit 111 has an improved accuracy compared to the ripple signal generated by conventional ripple count circuits.

The active filter circuit 110 includes a bandpass filter circuit 115, an amplifier circuit 116, and a comparator circuit 118. The bandpass filter circuit 115 includes a low-pass filter stage 112 and a high-pass filter stage 114 connected in series with the low-pass filter stage 112. An input 120 of the low-pass filter stage 112 is connected in common with the output terminal of the motor 102 and the input terminal of the shunt resistor 105 to receive an input drive current.

The amplifier circuit 116 includes a first amplifier 124 in signal communication with the high-pass filter stage 114. The amplifier 124 can include, for example, an operational amplifier (typically referred to as an "op amp") having an inverting input (−) and a non-inverting input (+). The inverting input (−) is connected to the output 122 of the high-pass filter stage 114, while the non-inverting input (+) is connected to an offset circuit 126. Accordingly, the amplifier circuit 116 receives the filtered input drive current and generates an amplified drive current signal.

The comparator circuit 118 is in signal communication with the output 128 of the amplifier circuit 116 to receive the amplified drive current signal. The comparator circuit 118 includes a first input low-pass filter 130, a second input low-pass filter 132 and a second amplifier 134. The second amplifier 134 includes, for example, an op amp that can operate as a differential amplifier having a non-inverting input (+) and an inverting input (−). For example, the comparator circuit 118 can compare the amplified drive current signal output from the amplifier circuit 116 to a reference voltage potential. Accordingly, the comparator circuit 118 can generate a pulsed signal having a first output voltage level when a voltage level of the amplified drive current signal is greater than or equal to the reference voltage potential, and a second output voltage level when a voltage level of the amplified drive current signal is less than the reference voltage potential. In this manner, the pulsed signal generated at the output 139 of the comparator circuit 118 can indicate an actual rotational speed (ω) and an actual rotational position (θ) of the rotor 103.

The inputs of the first and second input low-pass filters 130 and 132, respectively, are connected to the output 128 of the amplifier circuit 116. The output 135 of the first input low-pass filter 130 is connected directly to the non-inverting input (+) of the second amplifier 134, while the output 137 of the second input low-pass filter 132 is connected directly to the inverting input (−) of the second amplifier 134. The first and second input low-pass filters 130 and 132 are configured to filter the amplified drive current signal and minimize the parasitic noise delivered to the second amplifier 134.

The parasitic pulse cancelation circuit 111 is in signal communication with the active filter circuit 110 (e.g., output 139 of comparator circuit 118) to receive the pulsed signal. The parasitic pulse cancelation circuit 111 includes a logic gate 140 that operates in conjunction with the active filter circuit 110 and a pulse cancellation filter 142. Going forward, the logic gate 140 is described as an "OR" gate 140. However, it should be appreciated that other logic gates or combination of logic gates may be used without departing from the scope of the invention. The pulse cancellation circuit 111 can be configured so that it filters out parasitic pulses having a voltage level less than the threshold of the OR gate 140 during a targeted time duration (e.g., less than about 300 μs).

The OR gate 140 includes a first input 144 (Input A) and a second input 146 (Input B). The first input 144 is connected directly to the output 139 of the comparator circuit 118 to receive the pulsed signal. In one or more non-limiting embodiments, the pulse cancellation filter 142 is constructed as a low-pass RC filter including a resistor 150 and a capacitor 152. The input 148 of the resistor 150 is connected directly to the output 139 of the comparator circuit 118, while the output 154 of the capacitor 152 is connected directly to the second input 146 of the OR gate 140. The pulse cancellation filter 142 filters the pulsed signal output from the comparator circuit 118 to generate a filtered pulsed signal having a phase angle that effectively shifted (i.e., with respect the phase angle of the pulsed signal output from the comparator circuit 118) before it is applied to the second input 146. That is, RC capacitor 150 delays the phase angle of the pulsed signal output comparator circuit 118. Accordingly, the signal applied to the second input 146 of the OR gate 140 lags behind the pulsed signal applied to the first input of the OR gate 140. The signal applied to the first input 144 is therefore allowed to fall below the voltage threshold of the OR gate 140 such that the first input 144 is set to a logic "0", state while the signal applied to the second input 146 is maintained above the voltage threshold of the OR gate 140 such that the second input 146 is maintained at a logic "1" state. In this manner, the ripple count signal generated at the output 141 of the OR gate 140 remains at a logic "1" state during the targeted time duration, e.g., less than or about 300 μs. In other words, the output ripple signal provided by the OR gate output 141 will not change state and the parasitic pulses will be eliminated without expending additional CPU processing.

Figure 3:
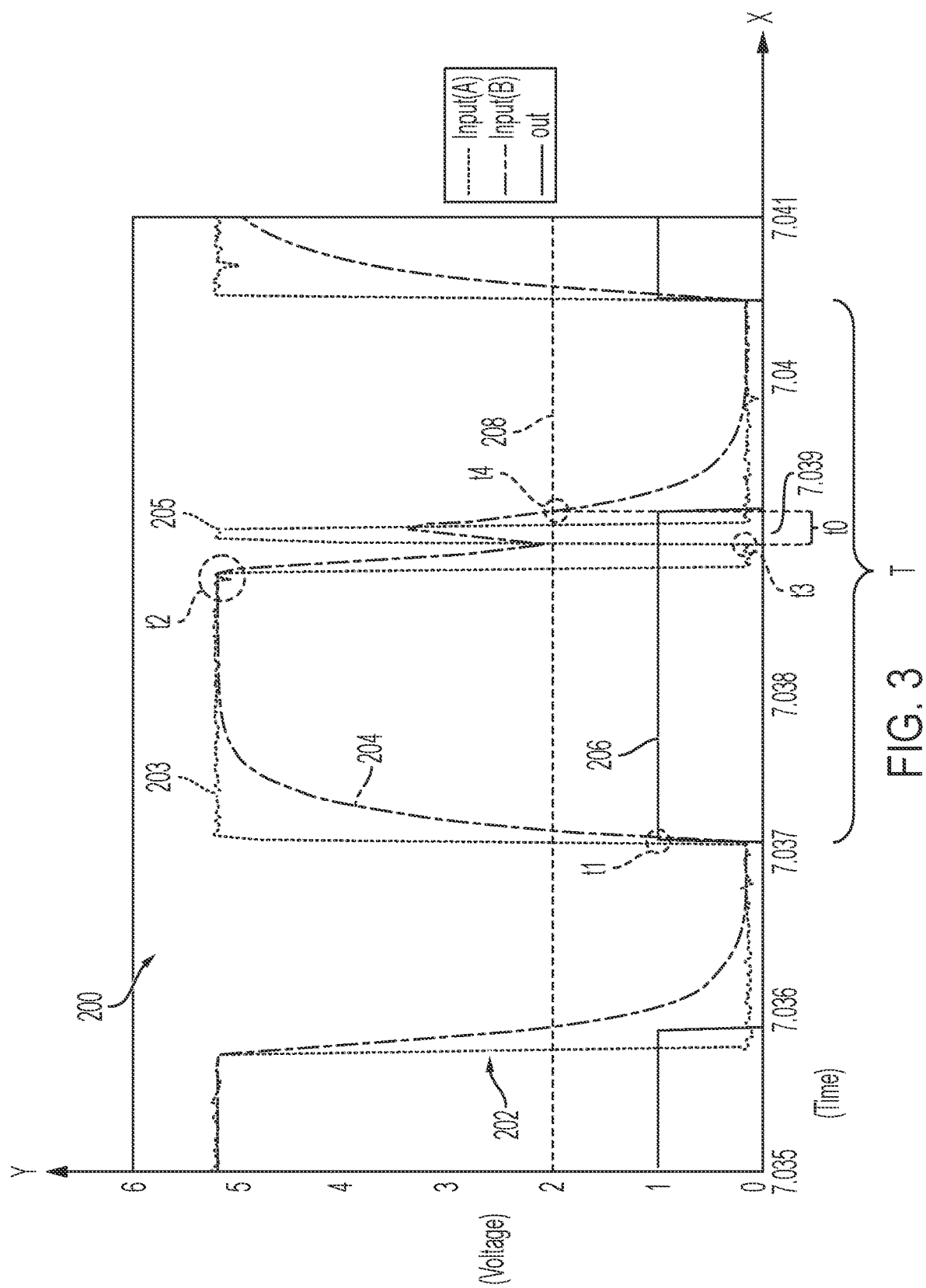
FIG. 3 is a signal diagram associated with the parasitic pulse cancellation circuit shown in FIG. 2 according to a non-limiting embodiment.

Turning to FIG. 3, a signal diagram 200 associated with the parasitic pulse cancellation circuit 111 is illustrated according to a non-limiting embodiment. The signal diagram 200 illustrates the first input signal 202 applied to the first input 144 of the OR gate 140, the second input signal 204 (i.e., the filtered pulsed signal) applied to the second input 146 of the OR gate 140, and the output signal 206 delivered from the output 141 of the OR gate 140. As described herein, the first input signal 202 is the pulsed signal received directly from the output of the active filter circuit 110. The first input signal includes a desired pulse 203 and may contain one or more parasitic pulses 205. The first input signal 202 including the desired pulse 203 and the parasitic pulse 205 defines a period (T). The second input signal 204 is received from the output of the pulse cancellation filter 142 and lags behind the first input signal 202. Accordingly, the ripple count signal 206 generated at the output 141 of the OR gate 140 can be maintained at a logic "1" for a targeted time duration t0 (e.g., less than or about 300 μs) without realizing the parasitic pulses 205 present in the first input signal 202. That is, the ripple count signal 206 has a logic "1" state for the entire period (T).

The OR gate 140 is configured to detect an input signal having a voltage level that exceeds a threshold voltage level 208. Although the threshold voltage level 208 is set at 2 volts (V) in this example, the voltage threshold can be set to different voltage levels depending on the system design without departing from the scope of the invention. Thus, input signals applied to the first and second inputs 144 and 146 that exceed 2V are set as a logic "1", while input signals applied to the first and second inputs 144 and 146 that are below 2V are set to a logic "0".

According to the example shown in FIG. 3, the OR gate generates a logic "1" output ripple count signal 206 in response to the voltage level of the first input signal 202 applied to the first OR gate input 144 exceeding the threshold 208 at time t1. At time t2, the first input signal 202 falls below the voltage threshold level 208 to approximately 0.5 V before the parasitic pulse 205 is generated at time t3. The second input signal 204 also begins falling at time t2, but lags the first input signal 202 and therefore is maintained above the voltage threshold level 208 via the pulse cancellation filter 142 during the targeted time t0. Accordingly, the OR gate output signal 206 continues outputting a logic "1" signal until time t4 when the second input signal 204 falls below the voltage threshold 208. At this time, both the parasitic pulse 205 and the second input signal 204 are below the voltage threshold 208. Accordingly, the output OR gate signal 206 transitions to a logic "0". As shown in FIG. 3, the output OR gate signal 206 can continuously transition between a logic "1" state and logic "0" state during period T while excluding the parasitic pulse 205 during the targeted time t0.

As described herein, a parasitic pulse cancelation circuit is provided to facilitate a hardware approach for eliminating parasitic pulses from a ripple signal associated with a DC motor circuit without expending CPU processing. In one or more non-limiting embodiments, the parasitic pulse cancelation circuit includes an OR gate that operates in conjunction with a bandpass filter and a pulse cancellation filter. The OR gate includes a first input directly connected to the output of the bandpass filter. The pulse cancellation filter includes a low-pass input terminal connected directly to the output of the bandpass filter and a low-pass output terminal connected directly to a second input of the OR gate. The low-pass filter can be configured so that it filters out parasitic pulses having a voltage level less than the threshold of the OR gate for a targeted time duration, e.g., less than about 300 μs. Accordingly, the ripple signal output from the bandpass filter will not change state and the parasitic pulse will be eliminated without requiring additional CPU processing.

As used herein, the term "module" refers to an application specific integrated circuit (ASIC), an electronic circuit, a microprocessor, a computer processor (shared, dedicated, or group) and memory that executes one or more software or firmware programs, a combinational logic circuit, a microcontroller including various inputs and outputs, and/or other suitable components that provide the described functionality. The module is configured to execute various algorithms, transforms, and/or logical processes to generate one or more signals of controlling a component or system. When implemented in software, a module can be embodied in memory as a non-transitory machine-readable storage medium readable by a processing circuit (e.g., a microprocessor) and storing instructions for execution by the processing circuit for performing a method. A controller refers to an electronic hardware controller including a storage unit capable of storing algorithms, logic or computer executable instruction, and that contains the circuitry necessary to interpret and execute instructions.

As used herein, the terms "first," "second," and the like, herein do not denote any order, quantity, or importance, but rather are used to distinguish one element from another, and the terms "a" and "an" herein do not denote a limitation of quantity, but rather denote the presence of at least one of the referenced item. In addition, it is noted that the terms "bottom" and "top" are used herein, unless otherwise noted, merely for convenience of description, and are not limited to any one position or spatial orientation.

The modifier "about" used in connection with a quantity is inclusive of the stated value and has the meaning dictated by the context (e.g., includes the degree of error associated with measurement of the particular quantity).

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A motor control system comprising:
   a direct current (DC) motor including a rotor induced to rotate in response to a drive current generated by a supply voltage, the rotation of the rotor generating a mechanical force that drives a component;
   a ripple count circuit including an active filter circuit and a parasitic pulse cancellation circuit,
   wherein the active filter circuit is configured to filter the drive current and to generate a pulsed signal containing at least one parasitic pulse; and
   wherein the parasitic pulse cancelation circuit is in signal communication with the ripple count circuit to receive the pulsed signal and to output a ripple count signal based on the pulsed signal, the ripple count signal excluding the at least one parasitic pulse,
   wherein the parasitic pulse cancelation circuit includes a pulse cancellation filter configured to receive the pulsed signal from the active filter circuit and to output a filtered pulsed signal based on the pulsed signal, and
   wherein the parasitic pulse cancelation circuit includes a logic gate having a first input configured to receive pulsed signal from the active filter circuit and a second input configured to receive the filtered pulsed signal from the pulse cancellation filter, the logic gate configured to generate the ripple count signal based on a first voltage level corresponding to the pulsed signal applied to the first input and a second voltage level corresponding to the filtered pulsed signal applied to the second input,
   wherein the ripple count signal has a logic high state in response to both the first voltage level and the second voltage level exceed a reference voltage and has a logic low state in response in response to both the first voltage level and the second voltage level being below the reference voltage.

2. The motor control system of claim 1, wherein the logic gate is an OR gate.

3. The motor control system of claim 1, wherein the pulsed signal has a time period (T) and the at least one parasitic pulse occurs during a targeted time duration (t0) of the period (T), and
   wherein the ripple count signal defines a time period (T) excluding the at least one parasitic pulse during the targeted time duration (t0).

4. The motor control system of claim 1, wherein the logic gate has a voltage threshold, the logic gate configured to determine a first logic state of the first and second inputs and in response to a voltage applied thereto being greater than or equal to the voltage threshold, and to determine a second logic state of the first and second inputs and in response to a voltage applied thereto being less than the voltage threshold.

5. The motor control system of claim 1, wherein the parasitic pulse cancelation circuit outputs the ripple count signal in response to maintaining the second voltage of the filtered pulsed signal above the voltage threshold while a voltage of the at least one parasitic pulse is below the voltage threshold.

6. A method of controlling a motor control system, the method comprising:
   generating a drive current using a supply voltage and delivering the drive current to a direct current (DC) motor;
   rotating a rotor of the motor in response to the drive current to drive a component;
   filtering the drive current using an active filter circuit and generating a pulsed signal based on the filtered drive current, the pulsed signal containing at least one parasitic pulse; and
   delivering the pulsed signal to the parasitic pulse cancelation circuit and generating, via the parasitic pulse cancelation circuit, a ripple count signal based on the pulsed signal, the ripple count signal excluding the at least one parasitic pulse,
   wherein generating the ripple count signal includes:
   delivering the pulsed signal to a pulse cancellation filter included in the parasitic pulse cancelation circuit, and filtering, via the parasitic pulse cancelation circuit, the pulsed signal to generate a filtered pulsed signal;
   outputting the pulsed signal from the active filter circuit to the logic gate to apply a first voltage level to a first input of a logic gate included in the parasitic pulse cancelation circuit;
   outputting the filtered pulsed signal from the pulse cancellation filter to the logic gate to apply a second voltage level to a second input of the logic gate; and
   outputting the ripple count signal from the logic gate based on the first voltage level corresponding to the pulsed signal and the second voltage level corresponding to the filtered pulsed signal,
   wherein the ripple count signal has a logic high state in response to both the first voltage level and the second voltage level exceed a reference voltage and has a logic low state in response in response to both the first voltage level and the second voltage level being below the reference voltage.

7. The method of claim 6, wherein the logic gate is an OR gate and the ripple count signal is generated according to digital logic of the OR gate.

8. The method of claim 6, wherein the pulsed signal has a time period (T) and the at least one parasitic pulse occurs during a targeted time duration (t0) of the period (T), and
   wherein the ripple count signal defines a time period (T) excluding the at least one parasitic pulse during the targeted time duration (t0).

9. The method of claim 6, further comprising:
   determining, via the logic gate, a first logic state of the first and second inputs in response to a voltage applied thereto being greater than or equal to a voltage threshold;
   determining a second logic state of the first and second inputs in response to a voltage applied thereto being less than the voltage threshold, and outputting, via the parasitic pulse cancelation circuit, the ripple count signal in response to maintaining the second voltage of the filtered pulsed signal above the voltage threshold while a voltage of the at least one parasitic pulse is below the voltage threshold.

* * * * *